United States Patent
Dockser et al.

[11] Patent Number: 5,963,454
[45] Date of Patent: Oct. 5, 1999

[54] METHOD AND APPARATUS FOR EFFICIENTLY IMPLEMENTING COMPLEX FUNCTION BLOCKS IN INTEGRATED CIRCUIT DESIGNS

[75] Inventors: Kenneth A. Dockser, San Jose, Calif.; Gregory E. Ehmann, Sleepy Hollow, Ill.

[73] Assignee: VLSI Technology, Inc., San Jose, Calif.

[21] Appl. No.: 08/719,610

[22] Filed: Sep. 25, 1996

[51] Int. Cl.[6] ............................................ G06F 17/50
[52] U.S. Cl. ............................................ 364/488; 364/489
[58] Field of Search ............................ 364/488, 489, 364/490, 491, 578

[56] References Cited

U.S. PATENT DOCUMENTS

| | | | |
|---|---|---|---|
| 4,922,432 | 5/1990 | Kobayashi et al. | 364/490 |
| 5,111,413 | 5/1992 | Lazansky et al. | 364/578 |
| 5,197,016 | 3/1993 | Sugimoto et al. | 364/490 |
| 5,465,216 | 11/1995 | Rotem et al. | 364/488 |
| 5,487,018 | 1/1996 | Loos et al. | 364/488 |
| 5,491,640 | 2/1996 | Sharma et al. | 364/488 |
| 5,493,507 | 2/1996 | Shinde et al. | 364/489 |
| 5,519,627 | 5/1996 | Mahmood et al. | 364/488 |
| 5,548,539 | 8/1996 | Vlach et al. | 364/578 |
| 5,572,712 | 11/1996 | Jamal | 395/500 |
| 5,581,781 | 12/1996 | Gregory et al. | 395/800 |
| 5,623,418 | 4/1997 | Rostoker et al. | 364/489 |
| 5,673,198 | 9/1997 | Lawman et al. | 364/489 |
| 5,680,318 | 10/1997 | Gregory et al. | 364/489 |
| 5,691,911 | 11/1997 | Gregory et al. | 364/489 |
| 5,703,789 | 12/1997 | Beausang et al. | 364/489 |

OTHER PUBLICATIONS

Microsoft Press Computer Dictionary, Oct. 1993, pp. 107, 114, 146, 1993.

*Primary Examiner*—Kevin J. Teska
*Assistant Examiner*—Leigh Marie Garbowski
*Attorney, Agent, or Firm*—Martine Penilla & Kim, LLP

[57] ABSTRACT

A method in accordance with the present invention for developing an integrated circuit design using a compilation tool includes: (A) developing at least one HDL template by: (a) creating the HDL template; (b) creating a parameter file and a parameter check file for the HDL template; and (c) encrypting the HDL template; (B) developing design specifications for use in creating HDL for synthesis and for use in compiling one or more macro blocks; (C) creating the HDL for synthesis; and (D) creating netlists for at least one macro block instantiated in the HDL template using the design specifications. A development tool of the present invention implements the method on a computer system to form a portion of an integrated circuit fabrication system.

31 Claims, 9 Drawing Sheets

METHOD AND APPARATUS FOR EFFICIENTLY IMPLEMENTING COMPLEX FUNCTION BLOCKS IN INTEGRATED CIRCUIT DESIGNS

DESCRIPTION

1. Technical Field

This invention relates generally to the design of integrated circuits and more particularly to the automated design of integrated circuits by compilation and synthesis.

2. Background Art

Over the past several decades, integrated circuits (ICs) have become an integral part of modern electrical devices. Rather than using "off-the-shelf" components, it is often desirable to use custom or semi-custom ICs. To permit easier logic design of custom or semi-custom ICs to fulfill specific performance constraints or circuit requirements and to aid in circuit fabrication, automated systems for design and manufacturing have been developed. Automated design systems are also widely used to design highly complex ICs and ICs having short life cycles.

One type of computer aided design (CAD) system is known as a "logic synthesis system." With such a system, the inputs, outputs and a high level design description are input into a computer using a hardware description language (HDL). Synthesis software then creates a logic design that performs the function described in the HDL.

A typical integrated circuit design and manufacturing process using synthesis begins with a high level design description, typically at the Register Transfer Level (RTL). Such an RTL description is made using an HDL such as VHDL or Verilog-HDL, both of which are commercially available. This HDL can be synthesized to form a "netlist" (i.e. a list of "nets") specifying components and their interconnections which perform the function described by the HDL. However, the actual placement plan of components on wafers and the topography of the wiring connections is reserved for a subsequent "layout" stage.

A conventional method 10 for fabricating an integrated circuit is outlined in a flowchart in FIG. 1A beginning at a step 12. In a step 14, a set of design specifications is developed. Generally, these specifications can include the overall integrated circuit performance and also specific functionality, size, and placement characteristics of components on a chip.

A logic designer will create an RTL description of the logic to be designed in a step 16 using an HDL. Common hardware description languages include the aforementioned VHDL and Verilog-HDL although any suitable language (such as a proprietary HDL) may be used. The RTL description of the design is then used in a step 18 to synthesize a netlist. The netlist may also be described in the hardware description language (HDL). A step 20 verifies the behavior and functionality of the netlist, and allows for the repeating of steps 16 and 18 if the behavior and functionality do not meet specifications.

As noted above, the netlist specifies which components (known as "cells" or "modules") will be connected but does not specify the precise wiring topography. A cell has one or more "pins" for interconnection with pins of other cells. The "netlist" therefore includes "nets" which define the connectivity between pins of the cells. In other words, a "net" is a set of electrically equivalent pins of a number of cells, which must be connected together to form a common electrical node. Components or cells described by the netlist will form a logic design satisfying the design specifications.

Further referring to the conventional process of FIG. 1A, the logic designer transfers the verified netlist description into a layout tool in a step 24. The layout step 24 performed by the layout tool determines the actual physical placement of cells on the "layout area" of integrated circuit die or chip to form an array of gates or standard cells. The "layout area" is the area designated for the active components of the IC. The "placement" step of the layout process is extremely time consuming, as it can take several days of computation on a computer workstation for ICs having several hundred thousands of gates. The actual routing of connections or "wires" between pins of the cells is also determined in layout step 24.

Caltech Intermediate Format (C. I. F.) data created in the step 24 is transferred in a step 26 to a mask fabrication tool where an integrated circuit mask is created. This mask will be used to create the integrated circuit chip or die. This mask is generated on a machine equipped to read C. I. F. data. This C. I. F. data can be transferred to this machine through a hard disk, magnetic tape, a floppy disk, or other transmission medium. It is also possible for the mask generating machine to be part of or the same machine that synthesizes the netlist.

An integrated circuit is produced in a step 28. A conventional method of producing the circuit is to use the mask created in step 26 in photolithography processes. Once the chip itself has been fabricated, the integrated circuit on the die must have connections to external circuitry. This is generally accomplished by attaching bonding wires and/or lead frames to the integrated circuit. The circuit is then encapsulated in packaging materials such as plastic. The design and fabrication of the integrated circuit is completed at this point, as indicated at 30.

As integrated circuits become more complex, it becomes more desirable for logic designers to have the ability to quickly implement complex function blocks into integrated circuit designs. One approach to quickly implementing complex function blocks into integrated circuit designs involves the instantiation of fixed netlists into logic designs. While instantiating a fixed netlist into logic designs works well for netlists which are for fixed definition devices, e.g. microprocessors, instantiating a fixed netlist for a block that may have a variety of configurations, e.g. a multiplier, is inefficient. For example, if a design requires a 14-bit multiplier block, but only a 24-bit fixed netlist multiplier is available, the resultant design would end up being larger and slower than necessary.

Another approach to quickly implementing complex function blocks into integrated circuit designs involves the use of macro templates created in RTL which enable a logic designer to modify parameters in the macro template prior to providing the macro template to a synthesis tool. This approach results in a less than optimal implementation of the complex function blocks as the synthesis of the macro template is not intimately tied into a target library. This is true because conventional logic synthesis tools break functions down into their primitive components and then try to map them back up to the target library, often missing special optimized cells. In addition, the developer of the macro template exposes a large amount of intellectual property which pertains to the macro template when the macro template is delivered to a customer, as a macro template is typically a listing of HDL code.

What is needed is an approach for efficiently implementing complex function blocks while providing some degree of intellectual property protection to the developer of the complex function block designs.

DISCLOSURE OF THE INVENTION

A method in accordance with the present invention for developing an integrated circuit design using a compilation tool includes: (A) developing at least one HDL template by: (a) creating the HDL template; (b) creating a parameter file and a parameter check file for the HDL template; and (c) encrypting the HDL template; (B) developing design specifications for use in creating HDL for synthesis and for use in compiling one or more macro blocks; (C) creating the HDL for synthesis; and (D) creating netlists for at least one macro block instantiated in the HDL template using the design specifications. A compilation tool of the present invention implements the above-described process on a general purpose computer system to form a portion of an integrated circuit fabrication process for the manufacture of custom, semi-custom, complex, short life-cycle, and other types of integrated circuits.

The present invention provides an improved method for providing encrypted HDL templates to logic designers which enable the logic designer to modify parameters associated with a design in order to produce a custom design, while providing some degree of protection for the intellectual property of the template designer. It is a major advantage of the present invention that the encrypted HDL template, and associated macros, may be efficiently combined with input from the logic designer to provide custom output. As the custom output does not contain all parameters, the logic designer is only provided with HDL for a particular implementation, and all of the intellectual property associated with the HDL templates is not revealed to the logic designer. This enables the logic designer to efficiently implement complex macro blocks, while providing some degree of protection of the intellectual property of the template designer.

Another advantage of the present invention is that the most appropriate macro for use in a given design is produced by compiling each macro instantiated in an HDL template with input provided by a logic designer. This not only helps in meeting design specifications, but also helps to improve the quality of a logic design. Additionally, unlike conventional synthesis tools, the macro block compiler works with an intimate knowledge of the target library. The compiler directly instantiates the appropriate complex cells resulting in smaller area and improved routability of the resultant chip.

These and other advantages of the present invention will become apparent upon reading the following detailed descriptions and studying the various figures of the drawings.

BEST MODES FOR CARRYING OUT THE INVENTION

Figure 1A:
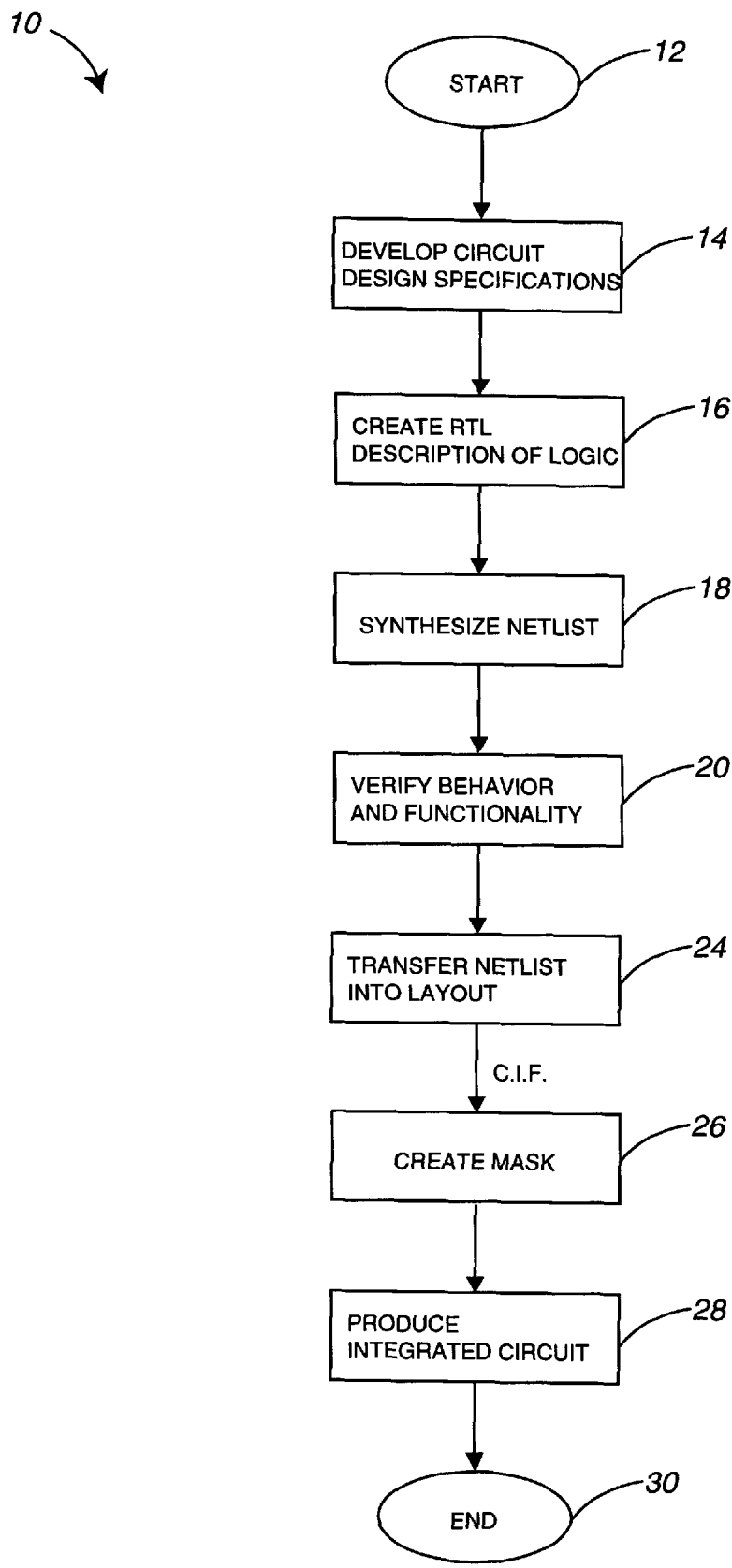
FIG. 1A is a process flow diagram illustrating a prior art process for designing and fabricating integrated circuits (ICs)
Figure 1B:
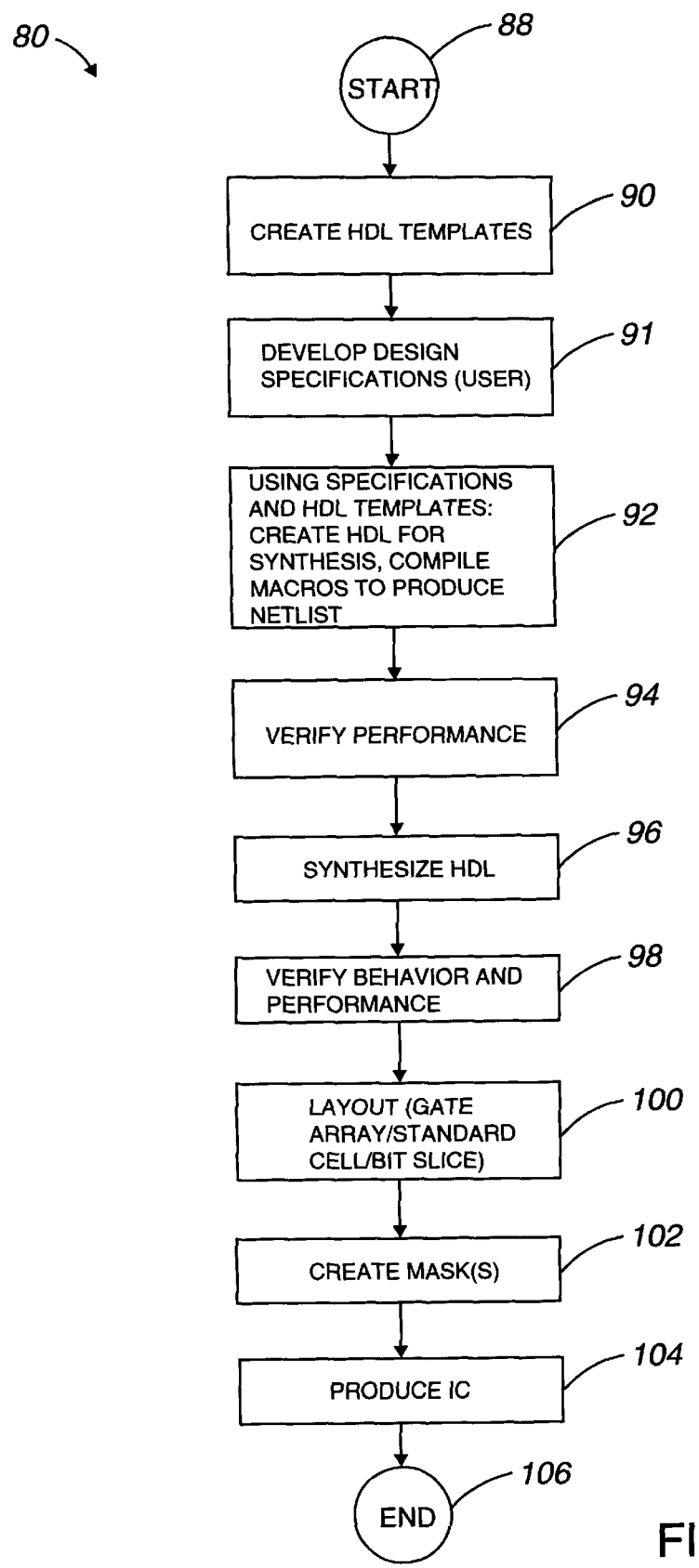
FIG. 1B is a process flow diagram illustrating a process for designing and fabricating integrated circuits (Ics) in accordance with the present invention.

FIG. 1A illustrates a prior art process for producing integrated circuits, and was discussed previously. FIG. 1B illustrates a process for producing integrated circuits in accordance with the present invention. The process 80 begins at a step 90 in which hardware description language (HDL) templates are created. An HDL template is a configurable piece of HDL code that a user, or a logic designer, may "control," or modify. A method of creating HDL templates will be described below with reference to FIG. 3. After HDL templates are created, in a step 91, design specifications are developed, using information provided by a user. In general, the step of developing design specifications, as described above with respect to FIG. 1A, can include parameters which relate to the overall integrated circuit performance and also specific size and placement characteristics of components on a chip. The development of design specifications using information provided by the user will be described below with respect to FIG. 4.

The design specifications developed in step 91 are used, along with the HDL templates created in step 90, to create, in a step 92, macro netlists and HDL that may be used to synthesize a netlist for the integrated circuit. Parameters and parameter check files may also be used in the creation of HDL which may be synthesized. Specific steps involved in the process of creating HDL which may be synthesized, i.e. "HDL for synthesis," will be described below with respect to FIG. 7. The macro netlists are then verified for performance in a step 94. It should be appreciated that if the performance of the compiled macros does not meet specifications, new compiled macros may be created. That is, step 92 may be repeated until suitable macro netlists are obtained.

It should be appreciated that a password, specific to a particular combination of parameters, may be required to enable HDL generation. Such a password may also be tied to a particular host computer and may also have an expiration date. The use of a password would enable a vendor to restrict a user to generate synthesizable HDL for a particular configuration only. Thus, the user would not be able to obtain the contents of the template by compiling all permutations.

Once the macro netlists meet specifications, a netlist is synthesized from the HDL for synthesis in a step 96. The netlist may be described in HDL, and may be synthesized using any suitable synthesizing software. A step 98 is the verification of the behavior of the synthesized netlist. It should be appreciated that step 98 allows for the repeating of steps 92, 94, and 96 if the behavior or performance of the synthesized and macro netlists fail to meet specifications. When the behavior and performance of the synthesized netlist is verified, the logic designer transfers the verified netlist description into a layout tool in a step 100. The layout step 100 performed by the layout tool determines the actual physical placement of cells on the "layout area" of integrated circuit die or chip to form an array of gates, standard cells, or bit slices. The actual routing of connections or "wires" between pins of the cells is also determined in layout step 100.

The data created in step 100, which is typically Caltech Intermediate Format (C. I. F.) data, is transferred in a step 102 to a mask fabrication tool where an integrated circuit mask is created. This mask will be used to create the integrated circuit chip or die. The generation of the mask was described previously with respect to FIG. 1A.

After the mask is created, an integrated circuit is produced in a step 104. A conventional method of producing the circuit is to use the mask created in step 102 in photolithography processes. Once the chip itself has been fabricated, the integrated circuit on the die must have connections to external circuitry. This is generally accomplished by attaching bonding wires and/or lead frames to the integrated circuit. The circuit is then encapsulated in packaging materials such as plastic. The design and fabrication of the integrated circuit is completed at this point, as indicated at 106.

Figure 2:
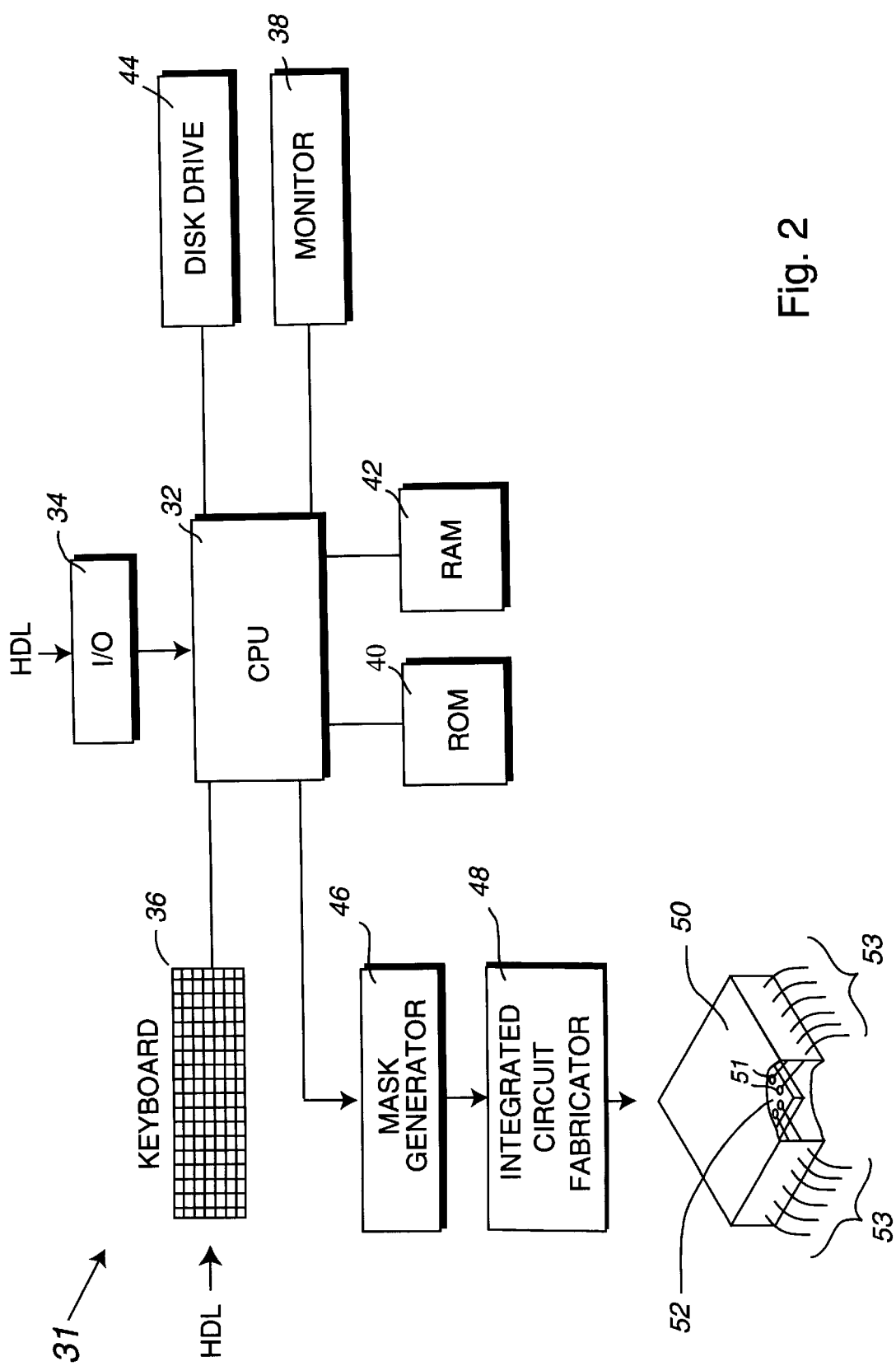
FIG. 2 is a block diagram of a system used to create integrated circuits.

In FIG. 2, a block diagram of an integrated circuit fabrication system 31 of the present invention is illustrated. The system 31 includes a central processing unit (CPU) 32, an I/O slot 34, a keyboard 36, a monitor 38, ROM 40, RAM 42, a disk drive unit 44, a mask generator 46, and an IC fabricator 48. CPU 32 is coupled to I/O port 34 and to a user input device such as keyboard 36. HDL can be received and input into the system 31 through the I/O port 34, the user input device 36 or another input channel such as disk drive 44.

Typically, HDL or HDL templates received through the I/O port 34 comes from another machine (computer). This would be the case, for example, when a netlist is synthesized by another computer. The user input device 36 usually takes the form of a keyboard. It permits the user, who may be a logic designer, to input design specifications or to control netlist manipulations performed by the CPU. Again typically, the logic designer using the input device or keyboard 36 will use a monitor 38 also coupled to the CPU 32.

The system processor 31 is preferably provided with various types of digital storage capacity. As shown in FIG. 2, this digital storage will typically include ROM 40, RAM 42, and a disk drive 44. The disk drive 44 may be used to store HDL received from the I/O ports 34 or the user input device 36 or may be used to enter HDL into the system, and it may store mask generation data created by processes running on the hardware description processor 31 and its CPU 32. The disk drive 44 may be replaced or augmented by other permanent storage devices such as magnetic tape or floppy disks. As noted, an original netlist can be either input through, for example, the I/O port 34 or the user input device 36, or it can be synthesized directly on the system 31.

From the netlist, the system 31 develops mask generation data. This mask generation data may be stored in digital storage, as for example the disk drive 44. The mask generator 46 receives the mask generation data from the CPU 32. Alternatively, (not shown) the mask generator 46 may receive mask generation data directly from digital storage such as the disk drive 44. The mask generator 46 may be part of the hardware description processor 31, or it may be a separate device. The mask generation data, or C.I.F., is used by the mask generator 46 to create photolithography masks. These masks will be used in an integrated circuit fabricator 48 to form components of the integrated circuit on a wafer. The mask will be sufficient to create the components on the integrated circuit and the connections between the components. The integrated circuit fabricator 48 includes semiconductor manufacturing equipment such as etchers, chemical vapor deposition (CVD) machines, lithography machines, etc. as is well known to those skilled in the art of semiconductor manufacturing.

The final result of processing by system 31 is a packaged integrated circuit 50. This packaged IC 50 will contain a die 52 created from using the mask created by the mask generator 46. The semiconductor die 52 typically contains a digital integrated circuit and I/O pads 51 for coupling the circuit to several leads 53. The I/O pads can be coupled to the leads 53 in any conventional manner such as by bonding wires.

As noted above, a netlist describes a net which, in turn, specifies the components (cells) and their theoretical interconnections. In other words, a netlist is a theoretical description of a logic design. For logic designs which are complex, templates may be used to enable a logic designer to modify parameters relating to a logic design prior to inputting the RTL into a synthesis tool.

Figure 3:
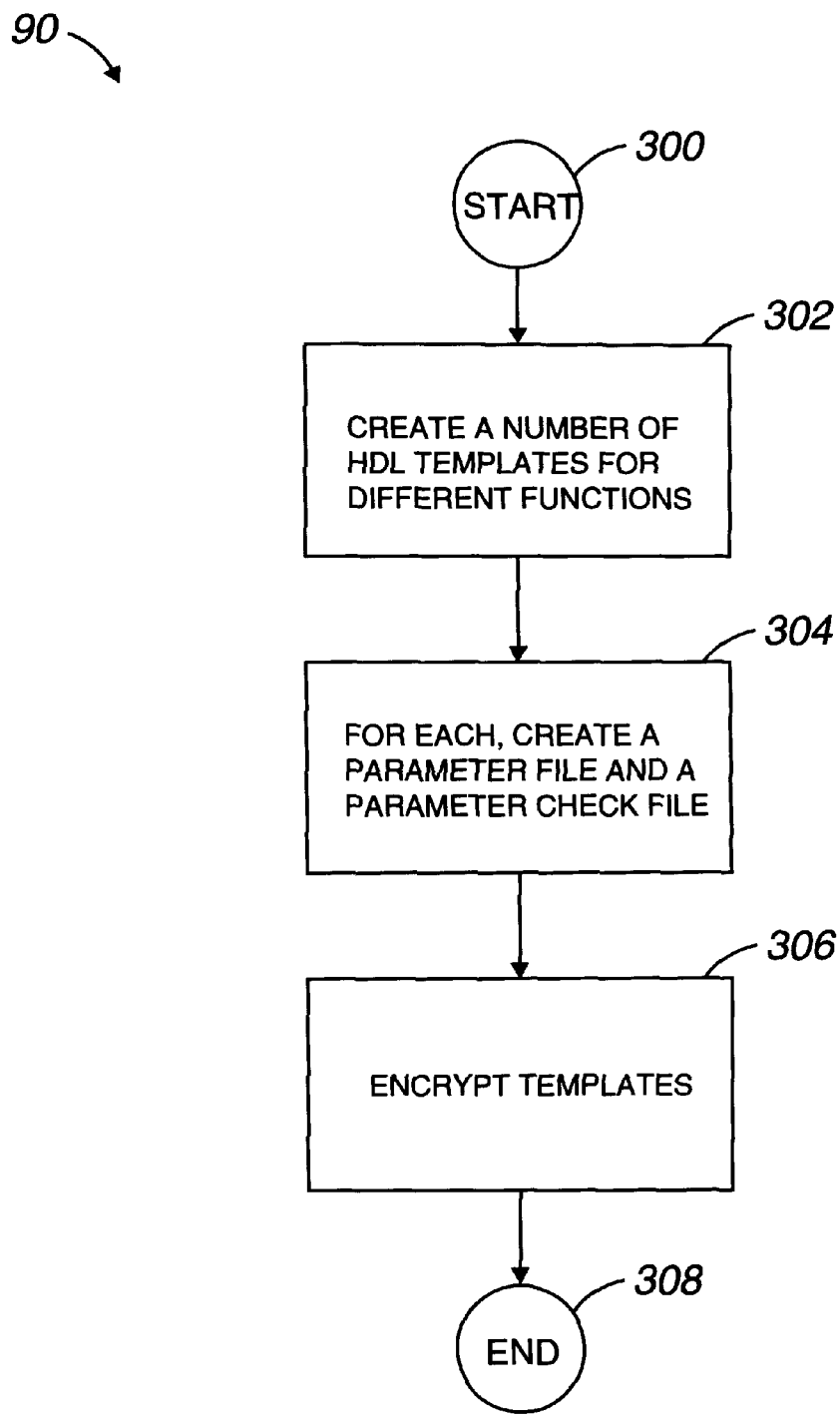
FIG. 3 is a process flow diagram illustrating the "CREATE HDL TEMPLATES" step of FIG. 1B.

FIG. 3 illustrates the process of creating HDL templates in more detail. The process 90 begins at 300 and, in a step 302, a number of HDL templates, which are specific for different functions, are created. In some embodiments, the different functions may be high-level functions. In a step 304, a parameter file and a parameter check file are created for each HDL template. The portion of each HDL template which pertains to parameters is obtained from the HDL template and used to create a parameter file. As such, the parameter file includes information used to define global parameters for the HDL template with which the parameter file is associated. As will be described below with respect to FIG. 4, the parameter file typically also includes information which may be used to define a user input window for the HDL template. That is, the parameter file is typically used to define a Graphical User Interface (GUI). A parameter check file, which is typically written in a scripting language that is specific to the compilation tool, is used to check the parameters in the parameter file to determine whether the parameters are legal entries. In other words, the parameter check file is used to perform error checks on the parameter file. Examples of a parameter file and a parameter check file may be found in Appendix 1 and Appendix 2, respectively.

In a step 306, the HDL templates are encrypted. Third-party encryption and decryption software tools, which may be used to encrypt templates, may be obtained from a number of vendors, including Globetrotter Software, Inc. of Campbell, Calif., the maker of "FLEXcrypt." The process of creating and encrypting HDL templates and macros is completed at 308.

Figure 4:
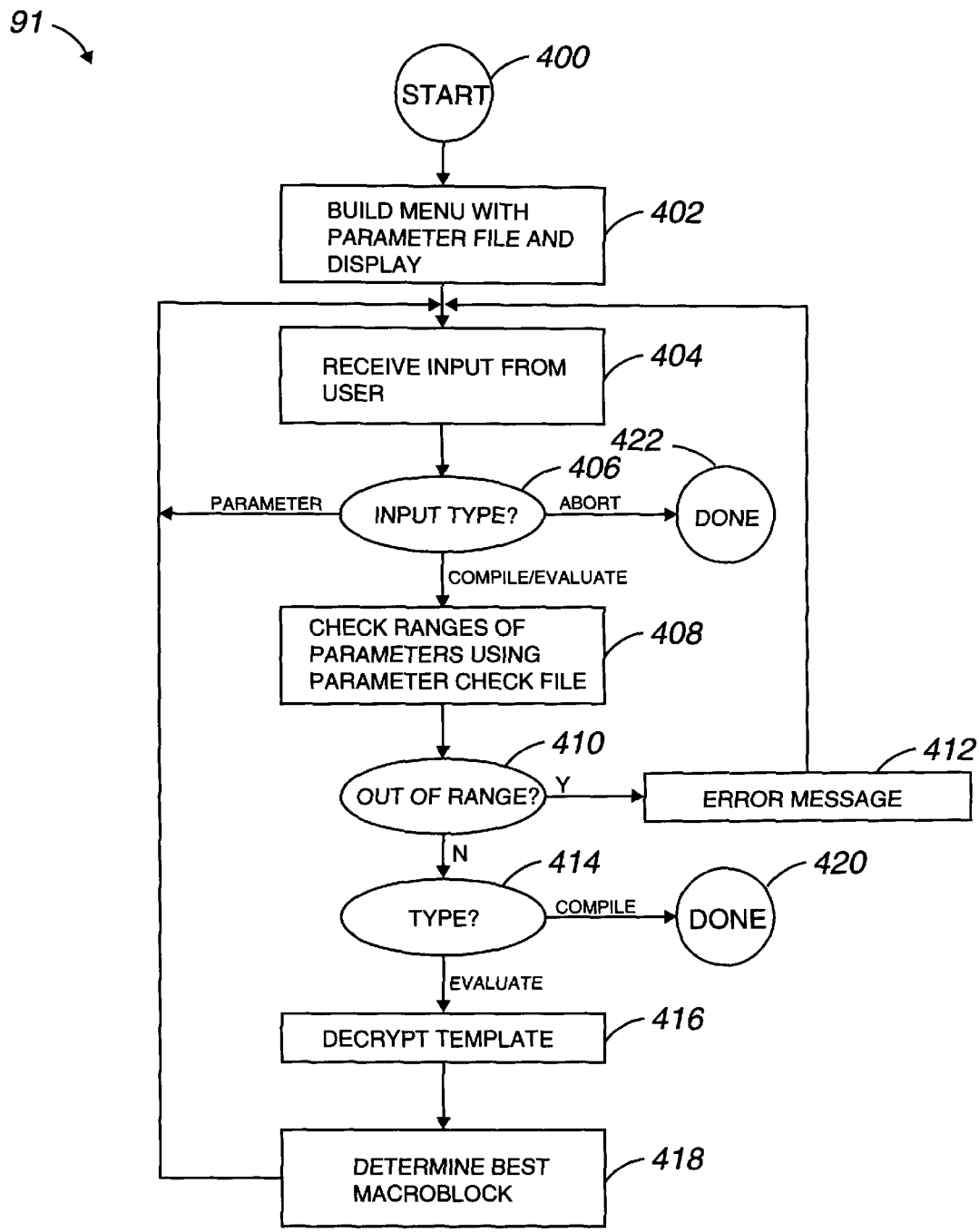
FIG. 4 is a process flow diagram illustrating the "DEVELOP DESIGN SPECIFICATIONS" step of FIG. 1B.

FIG. 4 illustrates the process of developing design specifications in more detail. The process 91 begins at 400 and, in a step 402, a menu is built using the parameter file and displayed on a screen display. The menu-related information in the parameter file may include, for example, a "menutitle" which may be used define the title of the menu item in the display. The contents of a menu as displayed will be described below with reference to FIG. 5. After the menu is created and displayed, input is received from the user in a step 404. The input may include, but is not limited to, design specifications in the form of parameters, requests to perform operations using parameters, and requests to abort the process of developing design specifications.

In a step 406, a determination is made regarding the type of input which was received from the user. In the described embodiment, the determination is made regarding whether the input is a parameter, a request to abort the process of receiving user input, or a request to compile or evaluate the parameters associated with the parameter file which was used to build the menu. If the determination is that the input type is a parameter, then process control returns to step 404. If the determination is that the input is a request to abort the process of receiving user input, then the process is completed at 422.

If the determination in step 406 is that the input is a request to compile or evaluate the parameters in the parameter file, then process control proceeds to a step 408 in which the ranges of the parameters are checked using an appropriate parameter check file. That is, the parameter check file performs an error check on the inputted parameters in the parameter file with which the parameter check file is associated. After the error check, in a step 410, a determination is made regarding whether any of the inputted parameters are out of the range. If it is determined that one or more of the parameters are out of range, then an error message is displayed on the screen in a step 412. After the error message is displayed, process control returns to step 404, the step of receiving input from the user, in order to provide the user with an opportunity to change the parameters which are out of range.

If it is determined in step 410 that none of the parameters are out of range, then process control proceeds to a step 414, which is the determination of whether the input received from the user in step 404 was a request to evaluate the HDL template and to determine an appropriate version of a macro block to be used in the resulting design, or a request to compile. If the input was a request to evaluate the design, then in a step 416, the HDL template that is associated with the parameters is decrypted using a decryption tool. Once the HDL template is decrypted, the best, or most suitable, macro block architecture for use in the actual design is determined in a step 418. The compiler tool will produce netlists for different architectures of the required macro block, and then choose the best one. For example, if the macro block is to be used in an adder, several different architectures of adders, e.g. carry-look ahead or carry skip, will be compiled and the resulting netlists would be analyzed for size, timing and other attributes. The best macro block will be the macro block which best serves to meet the specified design specifications in terms of timing and performance, for example. After the most suitable macro block architecture is identified, process control returns to step 404. If the input is determined in step 414 to be a request to compile, i.e. a compile command, then the process of developing design specifications is completed at 420.

Figure 5:
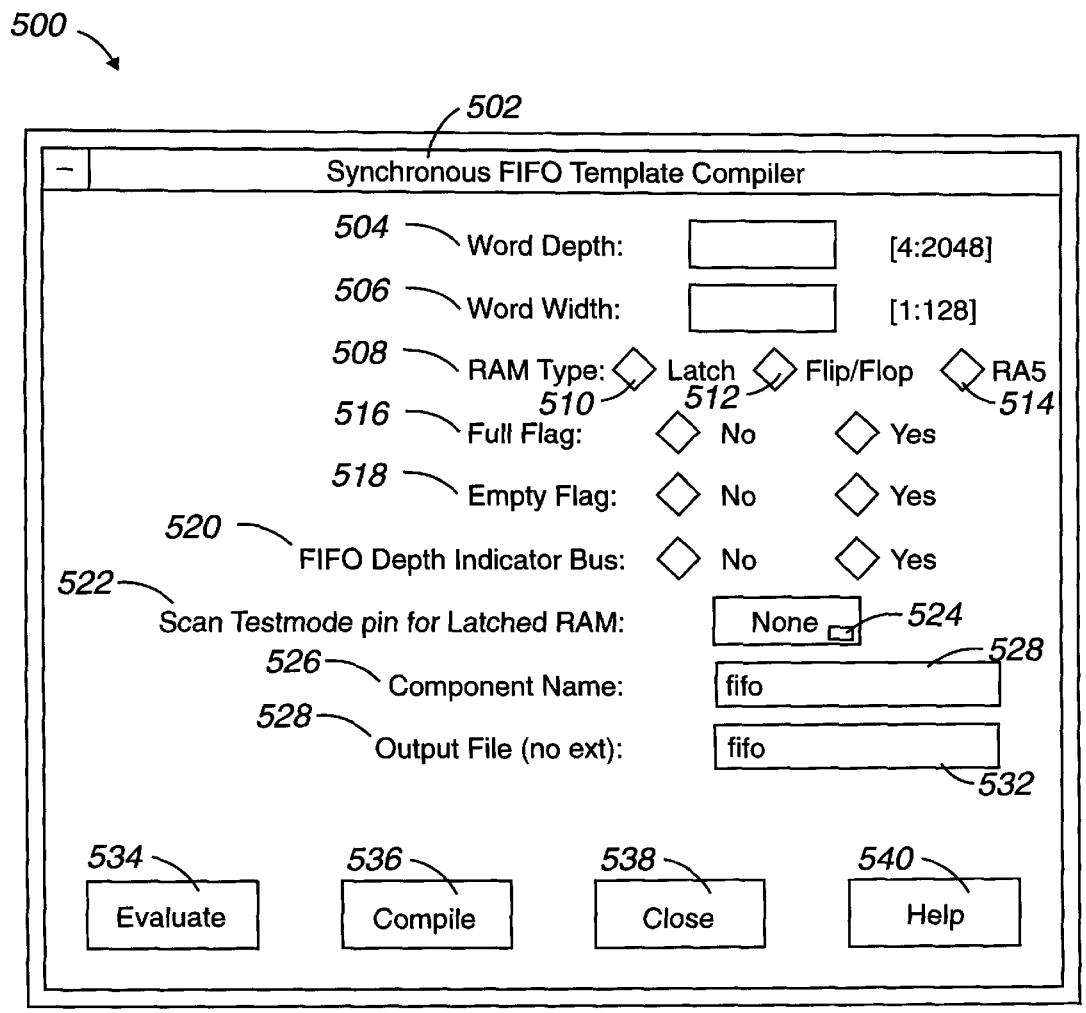
FIG. 5 is a diagrammatic illustration of a menu display used in the "BUILD MENU WITH PARAMETER FILE AND DISPLAY" step of FIG. 4.

FIG. 5 is an illustration of a menu display which is created from information provided in a parameter file. Menu 500 is typically a GUI, and is displayed on a monitor such that a user may access fields of menu 500 using a keyboard and a suitable pointing device such as a mouse. In the embodiment as shown, menu 500 is set up to take input information as used for a synchronous first-in/first-out (FIFO) memory. Menu 500 includes a menutitle 502 that is used to define the overall title, i.e. "Synchronous FIFO Template Compiler," of the information which is to be provided by the user.

A variety of physical parameters which relate to the random access memory (RAM) associated with the FIFO may be provided by the user. By way of example, a "word depth" 504 and a "word width" 506 may be specified. Word depth 504 and word width 506 are both integers which give a depth and a width indication, respectively, for the RAM. A "RAM type" 508 denotes the configuration for the memory core of the FIFO. In the embodiment as shown, the user may select RAM type 508 to be a latch type 510, a flip/flop type 512, or a RA5 type 514, depending on the requirements of a logic design.

The addition of a "full flag" 516 signal, which is used to indicate whether the memory core of the FIFO is full, may be selected by the user. Similarly, an "empty flag" 518, which indicates whether the memory core is empty, may be selected. A "FIFO Depth Indicator Bus" 520 which indicates how many words of the FIFO contain data may also be selected.

If a latch 510 is selected as the RAM type 508, then a latch with a testmode pin may be instanced, or instantiated, if the logic designer wishes. A "Scan Testmode pin for Latched RAM" selection 522 may be made by selecting an appropriate scanning option from an input selection box 524. The scanning options in input selection box 524 may include, as shown, a "none" option which indicates that the latches used for the RAM should not be of the scan type. Other options include a "buffered" option which indicates that the latches used for the RAM is to include a buffered signal to the testmode pins, and a "unbuffered" option which indicates that all testmode pins of the latches should be connected together without any sort of buffering.

A "component name" 526 is used to specify the name of the component which is being designed. In some embodiments, a default component name 528 may be the name of the component which is specified by menu 500. For example, as shown, the default component name 528 is "fifo." Similarly, an "output file name" 530 is used to specify the name of the file which contains the component identified by component name 526. A default output file name 532 may be the same as the name of the component which, in the embodiment as shown, is "fifo."

Menu 500 also includes interfaces which may be activated to select and to invoke commands. An "evaluate" command 534 may be selected to check the ranges of the inputted parameters, to decrypt the template created with the inputted parameters, and to determine the best macro block architecture for use in meeting the design specifications as given in the template, as described above with respect to FIG. 4. A "compile" command 536 may be selected to check the ranges of the inputted parameters, to decrypt the template, to use the inputted parameters to create HDL for synthesis, and to compile the macro blocks, as described above with respect to FIG. 4. A "close" command 538 may be selected to abort, or conclude, the process of inputting information using menu 500. If a "help" command 540 is selected, the result may, in some embodiments, be the display of a "help menu" which contains information that may define some of the parameters in menu 500. In other embodiments, help command 540 may display a general menu which includes information which may be used to access specific help menus, including help menus which pertain to the parameters as shown in menu 500.

Figure 6:
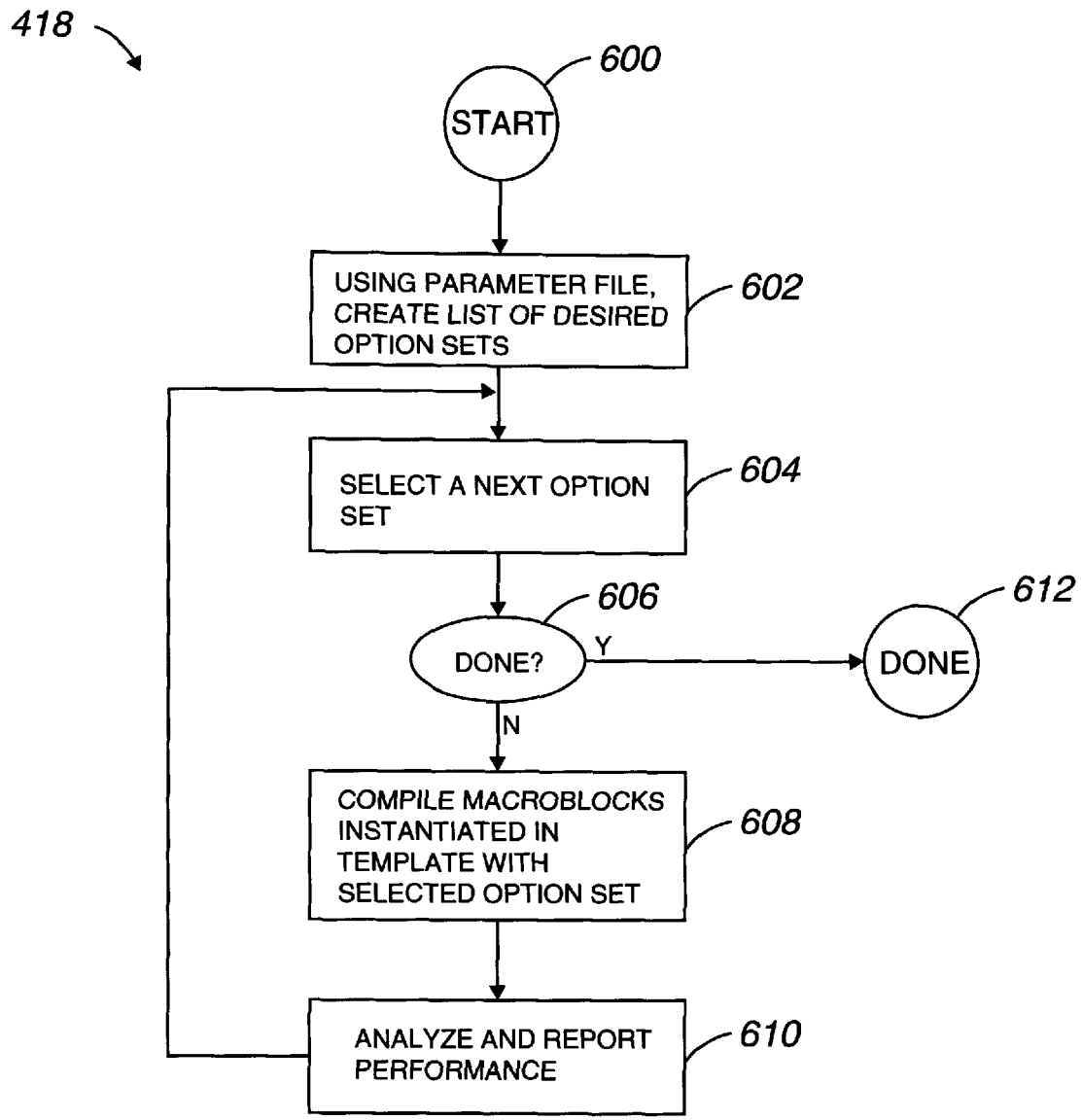
FIG. 6 is a process flow diagram illustrating the "DETERMINE BEST MACRO BLOCK" step of FIG. 4.

FIG. 6 illustrates the process of determining an appropriate macro block architecture for use in developing design specifications in more detail. The process 418 begins at 600 and, in a step 602, the parameter file associated with an HDL template is used to create a list of desired option sets, or a list of desired parameter combinations. In some embodiments, the parameter file is traversed to find all possible permutations of parameter combinations, which are then used to create a list of desired option sets. In other embodiments, the list of desired option sets is a subset of all possible option sets. In a step 604, an option set is selected from the list of option sets. A determination is made in a step 606 regarding whether there are any remaining option sets which have yet to be selected and analyzed. If there are no remaining option sets to be selected, then the indication is that all of the desired option sets have previously been selected and analyzed in terms of determining an appropriate macro block for use in the synthesis of a logic design, and the process of selecting an appropriate macro block is completed at 612.

If it is determined in step 606 that there are other desired option sets which may be selected, then process flow proceeds to a step 608 in which the macro blocks instantiated in the HDL template are compiled with the selected option set. Each macro block instantiated with the HDL template is called and compiled, to determine the performance of each macro block in combination with the selected option set.

In a step 610, the compiled macro blocks are analyzed, and the results of the analysis are typically evaluated and presented in a report which may be read by a logic designer. The report may include, but is not limited to, evaluations of the size, the speed, and the porosity, i.e. a measure of the ease of routing of a given design on an actual chip, of a logic design for each macro block compiled with the option set. The results of the analysis and subsequent evaluation are usually used to determine the most appropriate macro block to use for a given purpose. Once the compiled macro blocks are analyzed and evaluated, process control returns to step 604 and the selection of the next option set. It should be appreciated that when process control returns to step 604, information regarding the macro block which is most appropriate to use for a given purpose, based upon the option sets which have been previously been compiled with macro blocks, is available.

Figure 7:
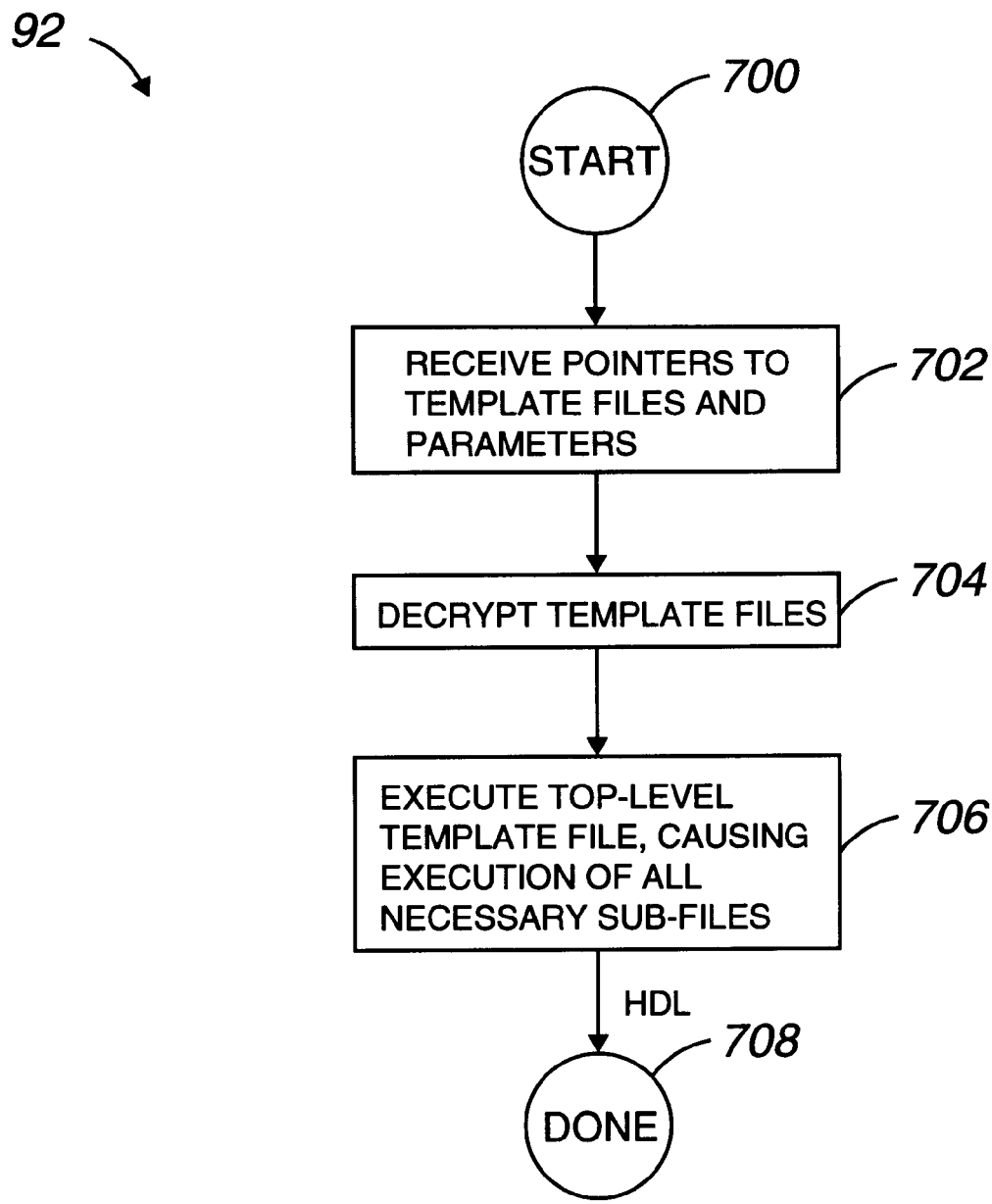
FIG. 7 is a process flow diagram illustrating the "USING SPECIFICATIONS, HDL TEMPLATES, AND PARAMETERS, CREATE HDL FOR SYNTHESIS, COMPILE MACROS TO PRODUCE NETLISTS" step of FIG. 1B.

FIG. 7 illustrates the process of using design specifications and HDL templates to create HDL for synthesis in more detail. It should be appreciated that the templates used to create HDL for synthesis are encrypted. The process 92 begins at 700 and, in a step 702, pointers to template files and parameters are received by a template compiler. The template files which are pointed to by the pointers include a "top-level" template file and any "lower-level" template files which are used by the top-level template file. It should be appreciated that the template files that are pointed to are encrypted template files. In a step 704, the template files are decrypted using a decryption tool such as a third party decryption tool as mentioned above with respect to FIG. 3. Typically, only the top-level template file and the lower-level template files that are needed by the top-level template file are decrypted.

The top-level template file is executed in a step 706. The execution of this top-level template file causes the execution of all necessary sub-files, or lower-level subordinate template files which may be required by the top-level template file. In some embodiments, lower-level template files may cause the execution of other lower-level template files. The step of executing the top-level template file and, hence, the necessary sub-files, in the process of creating HDL for synthesis provides for the nesting of calls. That is, each sub-file is executed sequentially until no sub-files remain to be executed. Sub-files may in turn invoke other sub-files. As will be appreciated by those skilled in the art, the execution of a file or sub-file may result in recursive execution. That is, the top-level file, or a sub-file, may call itself either directly or indirectly through a sequence of calls. In the described embodiment, the recursion is handled by the operating system. The execution of the template files will be described in more detail below with respect to FIG. 8. The execution of the top-level template file, and all necessary sub-files, results in the creation of HDL for synthesis as well as the compilation of macro blocks into netlists. The process of creating HDL for synthesis is then completed at 708.

Figure 8:
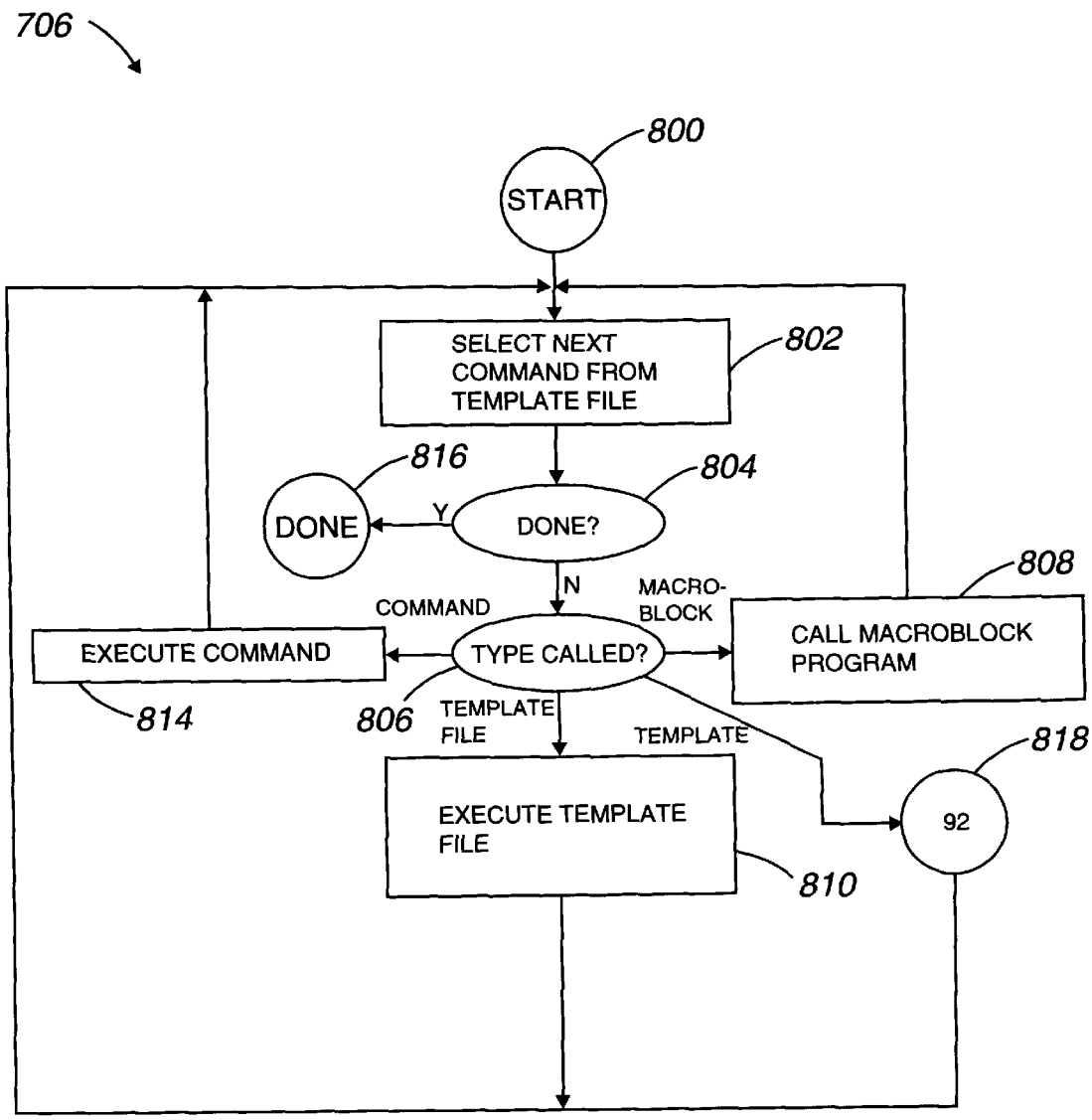
FIG. 8 is a process flow diagram illustrating the "EXECUTE TEMPLATE FILE, CAUSING EXECUTION OF ALL NECESSARY SUB-FILES" step of FIG. 7.

FIG. 8 illustrates the process of executing a template file in more detail. The process 706 begins at 800. In a step 802, a command is selected from the template file. The selected command is typically the first unexecuted command line, or next instruction, available in the template file. The top-level template file usually serves to call lower-level template files, although the top-level template file may also contain coded commands. An example of a top-level file may be found in Appendix 3. In a step 804, a determination is made regarding whether the last command from the template file, which may be a top-level template file, has been executed. If there are no remaining commands to be executed, then the process of executing a template file is completed at 816. It should be appreciated that the process of executing a template file is recursive. That is, until all of the commands from the initial top level template have been executed, the process of creating HDL for synthesis and compiling the instantiated macros will continue, i.e. process 706 will be repeated.

If there are commands to be executed, then process control proceeds to a step 806 which is the determination of what type of command was selected from the template file. In the described embodiment, four possible types of commands may be selected: a command to call a macro block program, a command to execute another template file, a command to execute a coded command contained in the top-level template file, and a command to return to a template graphical user interface (GUI).

If the type of command that is called is a command to call a macro block program, process control moves from step 806 to a step 808 where a macro block program, or compiler, is invoked. The macro block program produces a netlist for an appropriate macro block based on parameters specified in the GUI. After the macro block program is invoked, process control returns to step 802 and the selection of the next command from the template file to be executed.

If the type of command that is called is determined in step 806 to be a call to execute a template file, then at a step 810, the overall step of creating HDL for synthesis, as previously described with respect to FIG. 7, is repeated to decrypt any required, encrypted template files. After template files are decrypted, process control returns to step 802. It should be appreciated that, due to the fact that recursion is supported, the template file that is being called may be the same as the calling template file.

If it is determined in step 806 that the type of command that is called is a request to execute a command, i.e. an instruction or a data call, selected from the top-level template file, then process control proceeds from step 806 to a step 814 where the selected command is executed. After the command from the top-level template file is executed, process control returns to step 802.

If it is determined in step 806 that the type of command that is called is a request to return to a template GUI, then process control proceeds from step 806 to step 818 where a decryption tool is called to decrypt any required template files which are not already decrypted. In other words, the overall step of creating HDL for synthesis, as previously described with respect to FIG. 7, is repeated to decrypt any required, encrypted template files. By way of example, in the event that a top-level template file is specific for a UART, but information pertaining to FIFO memory is called by the top-level template file, it may be necessary to decrypt the template files associated with FIFO memory. In some embodiments, a GUI may be used to enable a logic designer to enter design specifications which relate to the "new," still encrypted, template files that are to be decrypted. In other embodiments, the specifications in the parameter files which relate to the new template files are used without using any new input from the logic designer. After template files are decrypted, process control returns to step 802.

After template files are decrypted, and a logic design is layed out using a netlist, as described earlier with respect to FIG. 1B, a mask fabrication tool may be used to create an integrated circuit mask which is used to create the integrated circuit chip or die. It should be appreciated that it is also possible for the mask generating machine to be part of or the same machine that is used to synthesize the netlist. Typically, the mask is used in photolithography processes to create an integrated circuit. Once the chip itself has been fabricated, the integrated circuit on the die must have connections to external circuitry. This is generally accomplished by attaching bonding wires and/or lead frames to the integrated circuit. The circuit is then encapsulated in packaging materials such as plastic, thereby producing an integrated circuit.

While this invention has been described in terms of several preferred embodiments, there are alterations, permutations, and equivalents which fall within the scope of this invention. It should also be noted that there are many alternative methods of implementing both the process and apparatus of the present invention. It is therefore intended that the following appended claims include all such alterations, permutations, and equivalents as fall within the true spirit and scope of the present invention.

APPENDIX 1

```
TITLE "Syncronous Interface FIFO - 1 Clock - Template"
MENUTITLE "Syncronous Interface FIFO - 1 Clock"
CHECKFILE "fifo.hpc"
VERILOGHDLFILE "fifo_ver.htf"
VHDLHDLFILE "fifo_vhd.htf"
HELPFILE "sisfifo.pdf"
SHORTNAME "sisfifo"
VERSION "1.0"
TEMPLAGEENABLED
DESCRIPTION -
"This is a fifo template complier, with synchronous read and write \n-
port interfaces and a single clock for read and write port operations.\n-
Providing Full, Empty, and Depth indications. \n-
\n-
Example:\n-
To compile a 8x8 fifo with Full & Empty flags\n-
hdli -shell sisfifo -FE -d 8 -b 8 -o test"
# variable         GUI              Shell Field       Right Hand
name             question         tag type          Text              Elements TP | DEPTH         | "Word Depth:"   | -d | INTERGER  | "[4:2048]" |    || "Word
depth"
TP | WIDTH         | "Word Width:"   | -b | INTERGER  | "[1:128]" |     || "Word
width"
TP | RAMTYPE       | "Memory Type:"  | -t | RADIO     |            |    ||-
"Latch" "Flip/Flop" "RA5" |-
"Use Latches for the memory core." -
"Use Flip/Flops for the memory core." -
"Use a complier RA5 ram for the memory core."
TP | SCAN | "Scan Testmode pin for Latched Memory:" | -T | OPTION ||| "NONE"
   "Buffered" "Unbuffered" | "No Testmode provided" "Buffered Testmode pin
   provided" "Unbuffered Testmode pin provided"
TP | DECODE | "Read Decode Type for Latched Memory:" | -D | RADIO || 0 |-
   "Muxed" "Tristate" |-
   "Use Muxes to generate the Read decode" "Use Tristates to generate the Read
   decode"
TP | RESET | "Controller Reset Type:" | -r | RADIO ||0 | "Asynchronous"
   "Synchronous" |-
   "Provide a asynchronous FIFO controller reset" "Provide a synchronous FIFO
   controller reset"
TP | FULL | "Full Flag?" | +F | RADIO | | 1 | "No" "Yes" |-
   "Provide full flag"
TP | EMPTY | "Empty Flag?" | +E | RADIO | | 1 | "No" "Yes" |-
   "Provide empty flag"
TP | LEVELBUS | "FIFO Depth Indicator Bus?" | +L | RADIO | || "No"
   "Yes" | "Provide Depth bus"
```

APPENDIX 2

```
#print("Synchronous Interface - Synchronous FIFO - Version",
VERSION,"\n");
#if(DEPTH < 4)
# error("The \"Word Depth\" must be greater than 4.\n");
# exit(1);
#endif

#if(DEPTH > 2048)
# error("The \"Word Depth\" must be less than or equal to 2048.\n");
# exit(1);
#endif

#if(DEPTH*WIDTH > 16384 && RAMTYPE == 2)
# error("The total number of bits for a RA5 RAM must be less than
```

APPENDIX 2-continued

```
16384.\n");
# exit(1);
#endif

#if(DEPTH > 64 && RAMTYPE < 2)
# error("If the depth is greater than 63 the \"RAM TYPE\"\nmust be of a
complied type (ie. RA5).\n");
# exit(1);
#endif

#if(WIDTH < 1)
# error("The \"Word Width\" must be greater than 0.\n");
# exit(1);
#endif

#if(WIDTH > 128)
# error("The \"Word Width\" must be less than or equal to 128.\n");
# exit(1);
#endif

#if(SCAN && RAMTYPE == 1)
# error("A Flip/Flop memory is fully SCAN testable, so this options is not
needed.\n");
# exit(1);
#endif

#if(SCAN && RAMTYPE > 1)
# error("The Scan option is only available for Latch memories.\n");
# exit(1);
#endif

#if(RAMTYPE == 2 && (substr(TARGETLIB,1,4) != "vsc7" &&
substr(TARGETLIB,1,4) != "vsc6"))
# error("The RA5 Ram is only supported in cell-based .6um and .5um
technoligies.\n");
# exit(1);
#endif

#if(RAMTYPE == 2 && DEPTH < 8)
# error("The RA5 Ram only supports depths greater than 8.\n");
# exit(1);
#endif

#if(ESTONLY)
All options are valid for this template. Push the "View DOC" button for
more information.
#endif

#include fifo__conns.htf
#if(LANGUAGE & LANG__VERILOG)
#include fifo__ver__doc.htf
#endif

#if(LANGUAGE & LANG__VHDL)
#include fifo__vhd__doc.htf
#endif

#exit(0);
```

APPENDIX 3

```
#string RAM_NAME;
#string DLY_NAME;
#int status;
#int statusall;
#status = 0;
#statusall = 0;
#RAM_NAME = FILENAME "_ram";
#DLY_NAME = FILENAME "_dly";

BUILD THE POST LIST
#include fifo__ver__head.htf

#if(RAMTYPE == 0)
LATCH RAM
#include fifo__ver)0.htf
```

APPENDIX 3-continued

```
#endif

#if(RAMTYPE == 1)
FF RAM
#include fifo__ver__1.htf
#endif
##if(RAMTYPE == 2)
RA5 RAM
#include fifo__ver__2.htf
#endif

BUILD THE TESTBENCH
#include fifo__ver__tb.htf

#if(TOOLSET == "Synopsys")
BUILD THE SYNOPSYS SYNTHESIS SCRIPT
#include fifo__ver__syn.htf
#endif

#if(TOOLSET == "Compass")
BUILD THE COMPASS SYNTHESIS SCRIPT
#include fifo__ver__cmp.htf
#endif

#exit(statusall);
```

We claim:

1. A method for developing an integrated circuit design using a compilation tool, said method comprising:
   (A) developing at least one HDL template by:
      (a) creating said HDL template; and
      (b) creating a parameter file and a parameter check file for said HDL template;
   (B) developing design specifications for use in creating a HDL for synthesis;
   (C) creating said HDL for synthesis, wherein said created HDL instantiates at least one macro block not defined in said HDL; and
   (D) creating a netlist for at least one macro block using said design specifications and said HDL template, wherein said macro block is compiled directly into a target library based on said design specifications.

2. A method as recited in claim 1 further comprising:
   synthesizing said netlist; and
   creating a layout using said synthesized netlist.

3. A method as recited in claim 1 further comprising creating at least one mask for said integrated circuit design.

4. An integrated circuit formed in accordance with the method as recited in claim 3.

5. A method as recited in claim 1 wherein said HDL for synthesis is created from said design specifications upon user input of a password related to said design specifications.

6. A method as recited in claim 1 wherein said design specification developing involves building a menu using information contained in said parameter file and displaying said menu, said menu being arranged to receive input from a user.

7. A method as recited in claim 6 wherein said design specification developing further includes checking ranges of parameters contained in said parameter file using information contained in said parameter check file.

8. A method as recited in claim 7 wherein said design specification developing further involves determining an appropriate macro for use in meeting said design specifications.

9. A method as recited in claim 8 wherein an appropriate macro determining involves using said parameter file to create a plurality of desired option sets.

10. A method as recited in claim 9 wherein said design specification developing further involves compiling said macro using an option set selected from said plurality of desired option sets.

11. A method as recited in claim 1 wherein said creating said HDL for synthesis includes:
   encrypting said HDL template;
   decrypting said encrypted HDL template; and
   executing said decrypted HDL template.

12. A method as recited in claim 11 wherein said executing said decrypted HDL template includes calling a second HDL template.

13. A method as recited in claim 11 further comprising:
   decrypting at least one subordinate encrypted HDL template which is called by said decrypted HDL template; and
   executing said decrypted subordinate HDL template.

14. A method as recited in claim 13 wherein said subordinate encrypted HDL template includes a recursive call to said decrypted HDL template calling.

15. A method for designing an integrated circuit using a compilation tool, said method comprising:
   (A) developing at least one top-level HDL template and one lower-level HDL template, wherein said top-level template is arranged to call said lower-level template, said template developing including:
      (a) creating said top-level and lower-level HDL templates to serve different functions; and
      (b) creating a parameter file and a parameter check file for each of said HDL templates, wherein said parameter file associated with said top-level template is used to create at least one option set;
   (B) developing design specifications for use in a creating HDL for synthesis, wherein a first macro instantiated in said top-level template is compiled with said option set;
   (C) creating said HDL for synthesis; and
   (D) creating a netlist for at least one macro block using said design specifications and said HDL templates.

16. A method as recited in claim 15 wherein said creating HDL for synthesis further includes:
   encrypting said top-level template;
   encrypting said lower-level template;
   decrypting said top-level template;
   decrypting said lower-level template; and
   executing said top-level template, wherein said top-level template is arranged to execute said lower-level template.

17. A method as recited in claim 15 further comprising verifying functionality and performance of said netlist.

18. A method for developing an integrated circuit design using a compilation tool, said method comprising:
   (A) developing one or more HDL templates by:
      (a) creating said one or more HDL templates, each template having different functions;
      (b) creating a parameter file and a parameter check file for each of said HDL templates; and
      (c) encrypting said HDL templates;
   (B) developing design specifications for use in creating a HDL for synthesis;
   (D) creating said HDL for synthesis by decrypting said encrypted HDL template; and
   (E) creating a netlist for at least one macro block using said design specifications and said HDL template.

19. A method as recited in claim 18 wherein said HDL created for synthesis compiles one or more macro blocks instantiated in said one or more HDL templates with one or more option sets.

20. A method as recited in claim 18 wherein said netlist creating for at least one macro block involves compiling said macro block directly into a target library based on said design specifications.

21. An integrated circuit design tool comprising:
   a computer system including a central processing unit (CPU) and memory coupled to said CPU;
   means for obtaining at least one HDL template, at least one parameter file, and at least one parameter check file for use in developing design specifications for an integrated circuit design;
   means for developing said design specifications by determining an appropriate macro for use in meeting said design specifications, said means for developing said design specifications further including:
      means for using said parameter file to create a plurality of desired option sets; and
      means for compiling said macro using an option set selected from said plurality of desired option sets;
   means for creating a HDL for synthesis using said design specifications and said HDL template; and
   means for creating a netlist using said design specifications and said HDL template.

22. An integrated circuit design tool as described in claim 21 wherein said means for creating a HDL for synthesis includes:
   means for encrypting said HDL template;
   means for decrypting said encrypted HDL template; and
   means for executing said decrypted HDL template.

23. An integrated circuit design tool as described in claim 22 further including:
   means for decrypting at least one subordinate encrypted HDL template which is called by said decrypted HDL template; and
   means for executing said decrypted subordinate HDL template.

24. An integrated circuit design tool as described in claim 21 further including means for creating at least one mask for said integrated circuit design.

25. An integrated circuit design tool as described in claim 21 wherein said means for developing said design specifications includes means for building a menu using information contained in said parameter file and displaying said menu, said menu being arranged to receive input from a user.

26. An integrated circuit design tool as described in claim 25 wherein said means for developing said design specifications further includes
   means for checking ranges of parameters contained in said parameter file using information contained in said parameter check file.

27. A method for developing an integrated circuit design using a compilation tool, said method comprising:
   (A) developing at least one HDL template by:
      (a) creating said HDL template; and
      (b) creating a parameter file and a parameter check file for said HDL template;
   (B) developing design specifications for use in creating a HDL for synthesis;
   (C) creating said HDL for synthesis including:
      (c) encrypting said HDL template;
      (d) decrypting said encrypted HDL template; and (e) executing said decrypted HDL template; and (D) creating a netlist for at least one macro block using said design specifications and said HDL template.

28. A method as recited in claim 27 further comprising:
synthesizing said netlist; and
creating a layout using said synthesized netlist.

29. A method as recited in claim 27 wherein said HDL created for synthesis instantiates at least one macro block not defined in said HDL.

30. A method as recited in claim 27 wherein said netlist creating for at least one macro block involves compiling macro block directly into a target library based on said design specifications.

31. A method as recited in claim 27 wherein said executing said decrypted HDL template includes calling a second HDL template.

* * * * *